US006549348B2

(12) United States Patent
Aizawa et al.

(10) Patent No.: US 6,549,348 B2
(45) Date of Patent: Apr. 15, 2003

(54) OPTICAL SCANNING DEVICE

(75) Inventors: Hidekuni Aizawa, Miyagi (JP); Yoshimasa Goda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/805,174

(22) Filed: Mar. 14, 2001

(65) Prior Publication Data

US 2002/0018274 A1 Feb. 14, 2002

(30) Foreign Application Priority Data

Mar. 15, 2000 (JP) ........................................ 2000-072576

(51) Int. Cl.[7] .............................. G02B 7/02; G02B 26/10
(52) U.S. Cl. ......................................... 359/824; 359/17
(58) Field of Search ................................ 359/813, 822, 359/823, 824, 814, 214, 223, 224, 290, 291, 196, 17; 73/504.02, 504.12; 348/96; 235/462.14, 462.32, 462.4, 462.43

(56) References Cited

U.S. PATENT DOCUMENTS 6,230,976 B1 * 5/2001 Sautter et al. ......... 235/462.36
6,311,894 B1 * 11/2001 Miyajima et al. ...... 235/462.36
6,388,793 B1 * 5/2002 Tamburrini et al. ......... 359/212

* cited by examiner

Primary Examiner—Georgia Epps
Assistant Examiner—Saeed Seyrafi
(74) Attorney, Agent, or Firm—Rader, Fishman, & Grauer PLLC; Ronald P. Kananen, Esq.

(57) ABSTRACT

An optical scanning device is provided, which is compact-sized and lightweight, and, which consumes less power. A movable member of the device is supported on a fixed member via a swing axis provided on the fixed member. On an upper surface and along an axial line of swing of the movable member, there are disposed a light emitting unit and a light receiving unit. When an AC current flows through a coil provided in the movable member, electromagnetic force acting on the coil when traversing a magnetic circuit comprising a yoke and a permanent magnet both provided on the fixed member urges the movable portion to swing around its swing axis at a predetermined cycle. A laser bean L from the light emitting unit scans a bar code and a reflected light L' from the bar cord is received by the light receiving unit thereby reading information of the bar code. The above structure of the device minimizes the drop in the efficiency of light reception and contributes to a compact and light-weight design, and less power consumption.

7 Claims, 10 Drawing Sheets

OPTICAL SCANNING DEVICE

BACKGROUND OF THE INVENTION

1. Field of the Invention

The present invention relates to an optical scanning device, which is applicable, for example, to an optical pickup for use in a bar code reader, an optical disk device and the like.

2. Description of the Related Art

A schematic diagram of a conventional optical scanning device applied to a bar code reader is shown in FIG. 9. In this optical scanning device, a laser beam L emitted from a light emitting unit 1 is directed via a first condenser lens 2 to a mirror 3, on which a light path of the laser beam L is converted so as to be directed to a bar code 4 which is an object of a laser irradiation. A reflected light from the bar code 4, after conversion of its light path again on the mirror 3, and via a second condenser lens 5, is received by a light receiving unit 6.

A drive rod 8a of a drive unit 8 comprising an electromagnet is firmly fixed to the mirror 3 for urging the mirror 3 to swing in directions of an arrow A in a predetermined cyclic motion around a fulcrum of a swing axis 7. Thereby, an emission of the laser beam L directed to this mirror 3 is used for scanning a whole area of the bar code 4, and the reflected light from the bar code 4 is received by the light receiving unit 6 for reading out information of the bar code 4.

However, in the conventional optical scanning device having the above-mentioned configuration, there needs to be some space secured between component parts, for example, between the light emitting unit 1 and the mirror 3, or between the mirror 3 and the light receiving unit 6, thereby limiting small-scaling of respective component parts necessary for compact-sizing of the device itself. In particular, in order to be able to receive efficiently a reflected light from the bar code 4, the second condenser lens 5 must be relatively large sized as shown in the drawing, thereby requiring a large space to be secured for installing such a large-sized condenser lens 5.

Recently, a field of application of the optical scanning device is expanding rapidly and in wide areas, however, in line with this trend, there is a growing demand for its lower power consumption, therefore, a further compactness of the device itself is strongly desired.

The present invention has been contemplated to solve the above-mentioned problem associated with the prior art and to provide a novel optical scanning device, which is capable of realizing a compact sizing, a lightweight and a lower power consumption.

SUMMARY OF THE INVENTION

In order to solve the above-mentioned problem, a novel optical scanning device according to the present invention is provided, which is comprised of: a movable member on which a light emitting unit for emitting a light and/or a light receiving unit for receiving a reflected light are mounted; a fixed member which supports the movable member swingably; and a drive unit which drives the movable member to swing so as to enable a laser beam scanning, wherein the above-mentioned light emitting unit and/or the above-mentioned light receiving unit are disposed on a same surface of the movable member, and along a swing axial line of the movable member with respect to the fixed member.

Namely, a compact design of the device is pursued by directly mounting the light emitting unit and the light receiving unit on the movable member. Further, improvement in efficiency of light reception by the light receiving unit is pursued by disposing the light emitting unit and the light receiving unit on the same surface of the movable member, and along the swing axial line of the movable member.

Further, in order to solve the above-mentioned problem, an optical scanning device according to the present invention is provided, which is characterized by comprising an optical path conversion surface which has a swing axis, and directs a light path of a beam from a light emitting unit to an object to be irradiated with the beam while swinging around the swing axis, and receives a reflected light from the object irradiated with the beam, wherein the light receiving unit for receiving the reflected light is mounted on the light path conversion surface.

As described heretofore, according to the optical scanning device of the present invention, there is accomplished the following advantages that a total size of the device can be reduced into a more compact size than a conventional device thereby providing an increased degree of flexibility for installing the device, and also contributing to a cost reduction of the device, a lightweight design, a low power consumption, and an improved performance of the device.

According to an aspect of the present invention, a novel swing mechanism having a simple structure for moving the movable member is obtained thereby contributing to a cost reduction of the device.

According to another aspect of the present invention, a swing mechanism having a swing axis for swinging a very small scaled optical scanning device can be formed simply using the semiconductor production processing technique thereby contributing greatly to a compact design of the device.

According to another aspect of the present invention, a novel swing mechanism for the movable member can be obtained simply without need of applying any special processing to the movable member.

According to further another aspect of the present invention, a compact and low power consumption drive mechanism applicable to each swing mechanism, having the above-mentioned structure can be obtained.

According to another aspect of the present invention, a compact design of the device is attained without need of securing a large space for installing a light receiving unit, and without lowering the efficiency of light reception.

According to an aspect of the invention as claimed in claim 7, a further improved efficiency in the light reception can be realized.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIGS. 7A and 7B are perspective views each showing a modification of the optical scanning device of FIG. 3, wherein FIG. 7A shows a swing mechanism using an electromagnetic force, and FIG. 7B shows a swing mechanism using vibration of a piezoelectric body;

FIG. 8A shows a monolayer parallel arrangement structure, and FIG. 8B shows a multi-layered vertical arrangement structure.

PREFERRED EMBODIMENTS OF THE INVENTION

Preferred embodiments of the present invention will be described in the following with reference to the accompanying drawings. The embodiments of the optical scanning device according to the invention will be described by way of example as applied to a bar code reader in the following.

Figure 1:
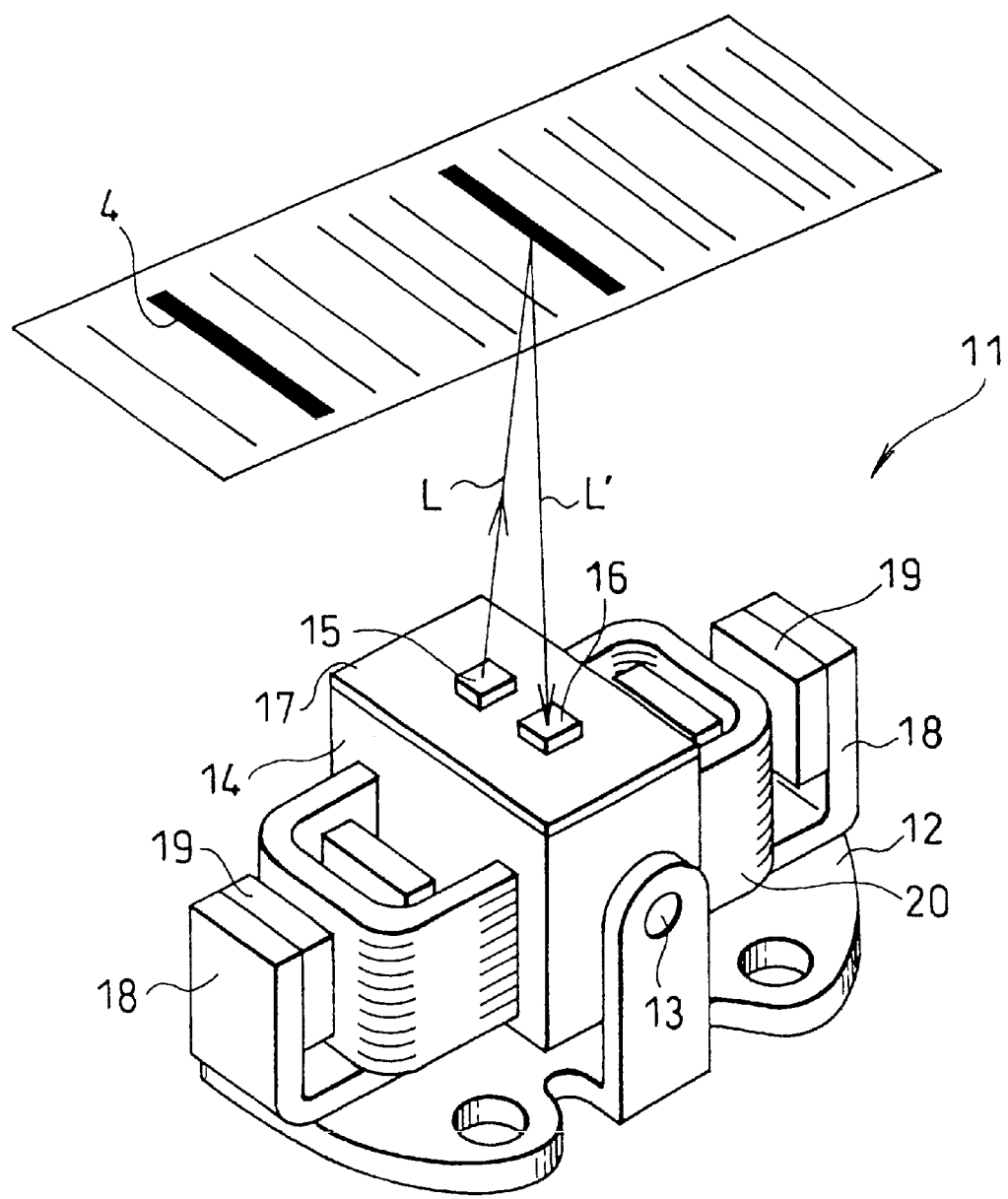
FIG. 1 is a perspective view of an optical scanning device according to a first embodiment of the invention.
Figure 2:
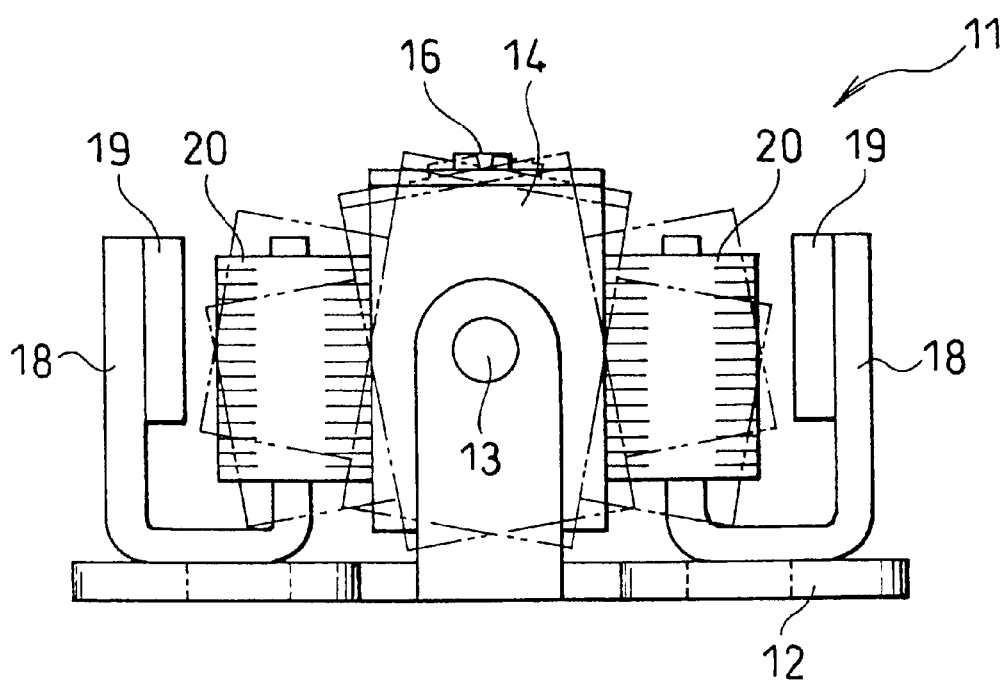
FIG. 2 is a front view of the optical scanning device of FIG. 1.

FIGS. 1 and 2 show an optical scanning device 11 according to a first embodiment of the present invention. A movable member 14 is supported swingably around a swing axis 13 which is provided integrally with a fixed member 12 which is fixed firmly on a casing which is not shown. On an upper surface of the movable member 14, there is firmly bonded a substrate 17 on the same surface of which a light emitting unit 15 comprising a light emitting element, and a light receiving unit 16 comprising a light receiving element are mounted. The light emitting unit 15 and the light receiving unit 16 mounted on the substrate 17 are disposed along an axial line of the swing axis 13 which penetrates through the movable member 14, and proximate to each other.

On both sides of the fixed member 12 and with respect to a border line of an axial line of the swing axis 13, there are mounted a pair of yokes 18 and 18 having a U-shape pattern. On an internal wall of each yoke 18, there is firmly fixed a permanent magnet 19 integral therewith. A coil 20, which is wound around the movable member 14, is placed so as to pass through a magnetic circuit which is comprised of the pair of yokes 18, 18 and the permanent magnets 19, 19. These yokes 18, permanent magnets 19 and coil 20 constitute a derive unit according to the present invention.

By way of example, wiring between each element of the light emitting unit 15 or the light receiving unit 16 and the substrate 17, although not shown, is connected with a bonding wire. Further, a condenser lens for condensing rays of light is provided integral with each unit 15, 16 or in a light path from its light emission unit to its light reception unit, however, its description is omitted from the drawings. Still further, although not shown, a damping means for controlling resonance of the movable member 14 is provided.

The optical scanning device 11 according to this preferred embodiment of the present invention has the aforementioned structure and arrangement. Now, a function of this optical scanning device will be described in detail in the following.

When an AC current flows through the coil 20, electromagnetic forces (Lorenz's forces) each driving in a reverse direction to each other are applied from the magnetic circuit comprised of the pair of yokes 18 and the permanent magnets 19 to the movable member 14 so as to swing around the swing axis 13 with respect to the fixed member 12. A cycle of swing motion of the movable member 14 is determined by a frequency of the AC current flowing through the coil 20 (approximately at 40 Hz in this embodiment of the present invention).

Simultaneously, when the laser beam L is emitted from the light emitting unit 15, the laser beam L is caused to scan a whole area of the bar code 4 which is positioned in an upper direction. A region of scanning by the laser beam L is controlled by an angle of swing of the movable member 14 relative to the fixed member 12. A reflected light of the laser beam L reflected from the bar code 4 is received by the light receiving unit 16 mounted on the movable member 14 so as to read out a signal according to a bar code pattern.

At this time, because the light receiving unit 16, together with the light emitting unit 15, is always allowed to face a direction of the bar code 4 on which the laser beam L is irradiated, the reflected light of the laser beam L reflected from the bar code 4 is ensured to be received efficiently. Further, because that the light emitting unit 15 and the light receiving unit 16 are disposed along the swing axial line of the movable member 14, a deviation of optical axes between the light emitting unit 15 and the light receiving unit 16 due to an angle of swing can be minimized, thereby enabling more efficient reception of the reflected light.

Further, by disposing these light emitting unit 15 and light receiving unit 16 in close proximity to each other, there are obtained such advantages that not only an efficiency in reception of a main light beam is improved, but also an adverse effect by noise components of light such as a disturbance light, stray light and the like is minimized, thereby substantially improving a total efficiency of light reception. Therefore, it is contemplated that the above-mentioned effect can be substantially increased if an optical composite element, which integrates the light emitting unit 15 and the light receiving unit 16, is used.

According to this embodiment of the present invention described above, the compact and light-weight design of the device and lower power consumption are realized by mounting the light emitting unit 15 and the light receiving unit 16 directly on the movable member 14, and also a drop in the efficiency of light reception due to the compact design of the device can be prevented.

Figure 3:
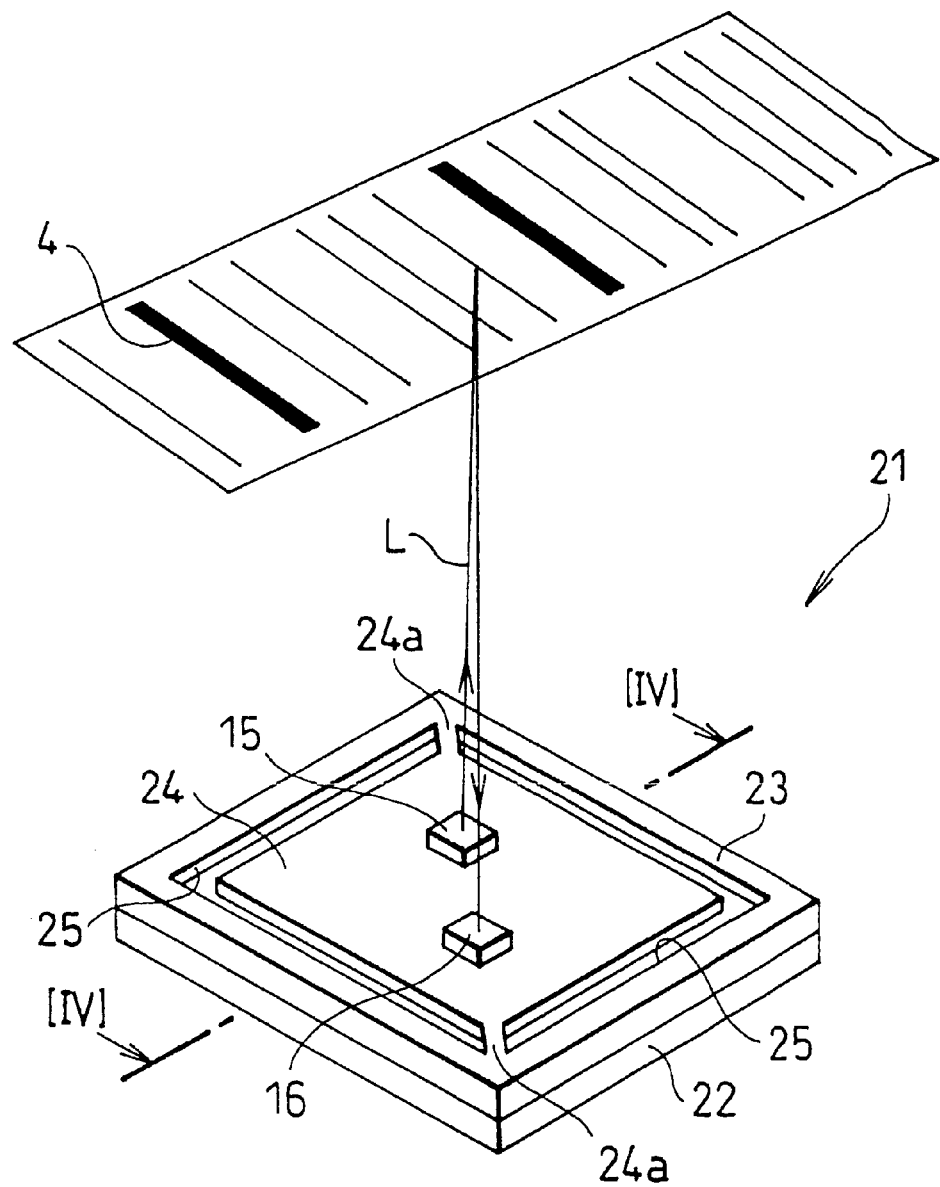
FIG. 3 is a perspective view of an optical scanning device according to a second embodiment of the invention.
Figure 4:
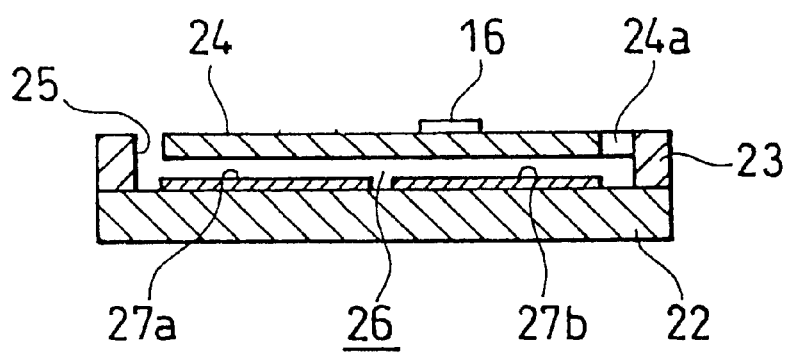
FIG. 4 is a cross-sectional view of the optical scanning device cut out along line [IV]–[IV] of FIG. 3.

A second embodiment of the present invention will be described with reference to FIGS. 3 and 4. The same parts with the same numerals corresponding to those in the first embodiment of the present invention will be omitted of their detailed description.

An optical scanning device 21 according to the second embodiment of the present invention is comprised of a glass substrate 22 which serves as a fixed member, and a silicon substrate 23 having a light emitting unit 15 and a light receiving unit 16 mounted thereon, in which the silicon substrate 23 is bonded on the glass substrate 22. The silicon substrate 23 is provided with a slit 25 which is formed using a conventional etching technique, and its internal region within the slit is used as a movable member 24. It is on this movable member 24 that its light emitting unit 15 and light receiving unit 16 are mounted.

The movable member 24 is supported by a portion of the silicon substrate 23 which is integral with the glass substrate 24 and is placed outside the slit 25, via a pair of bridging members 24a which are provided at two opposing points in the periphery of the movable member 24 so as to face the glass substrate 22 spaced apart therefrom with a space 26 having a predetermined distance. Electrode portions 27a and 27b are formed on the glass substrate 22 opposite to the bottom surface of the movable member 24 and on both sides relative to a line connecting the pair of bridging members 24a and 24a.

Therefore, when a voltage is applied to these electrode portions 27a and 27b by changing its polarity cyclically, a coulomb's force acts on the bottom surface of the movable member 24 so as to obtain a swing action of the movable member 24 around a swing axis along the line connecting between the pair of bridging members 24a and 24a.

According to the second embodiment of the present invention described above, further improvements in the compact and lightweight design and lower power consumption of the device can be realized while securing the same function and effect as those obtained in the first embodiment of the present invention. In particular, according to this embodiment of the invention, because of applicability of a series of semiconductor production processing which is capable of manufacturing a very precision product, a novel optical scanning device integrated into a very small size of a 2 mm square can be provided.

Figure 5:
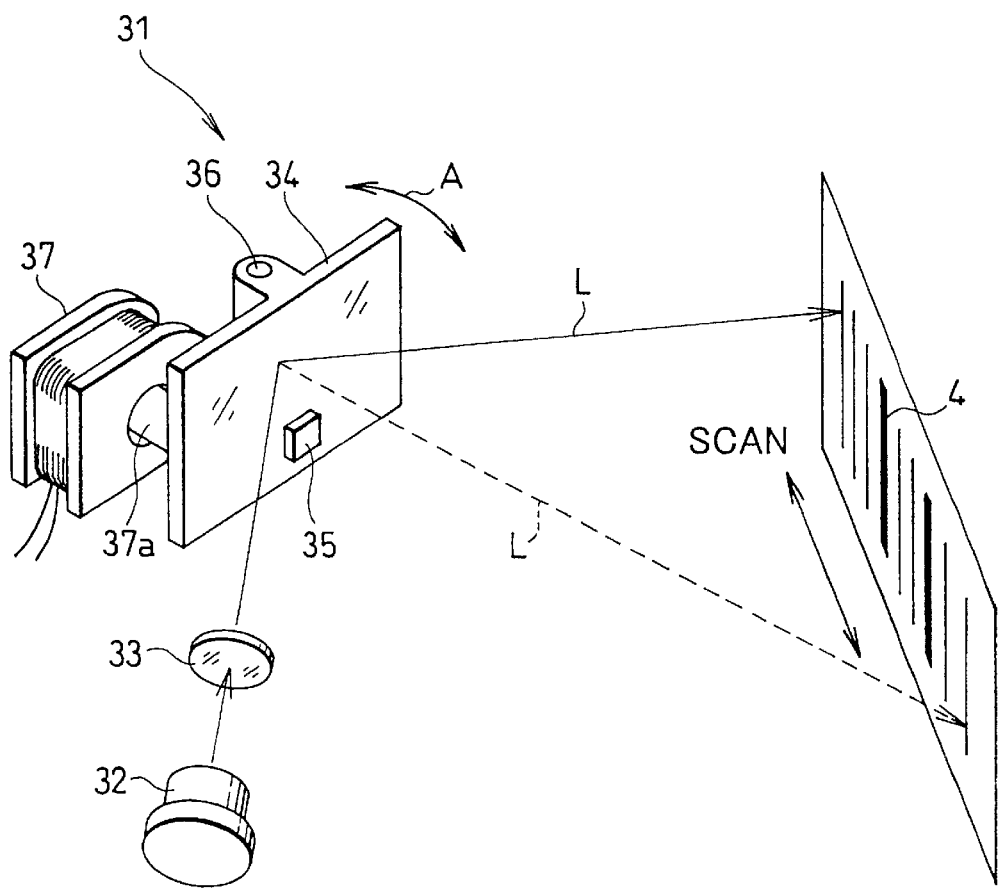
FIG. 5 is a schematic diagram showing an optical scanning device according to a third embodiment of the invention.
Figure 9:
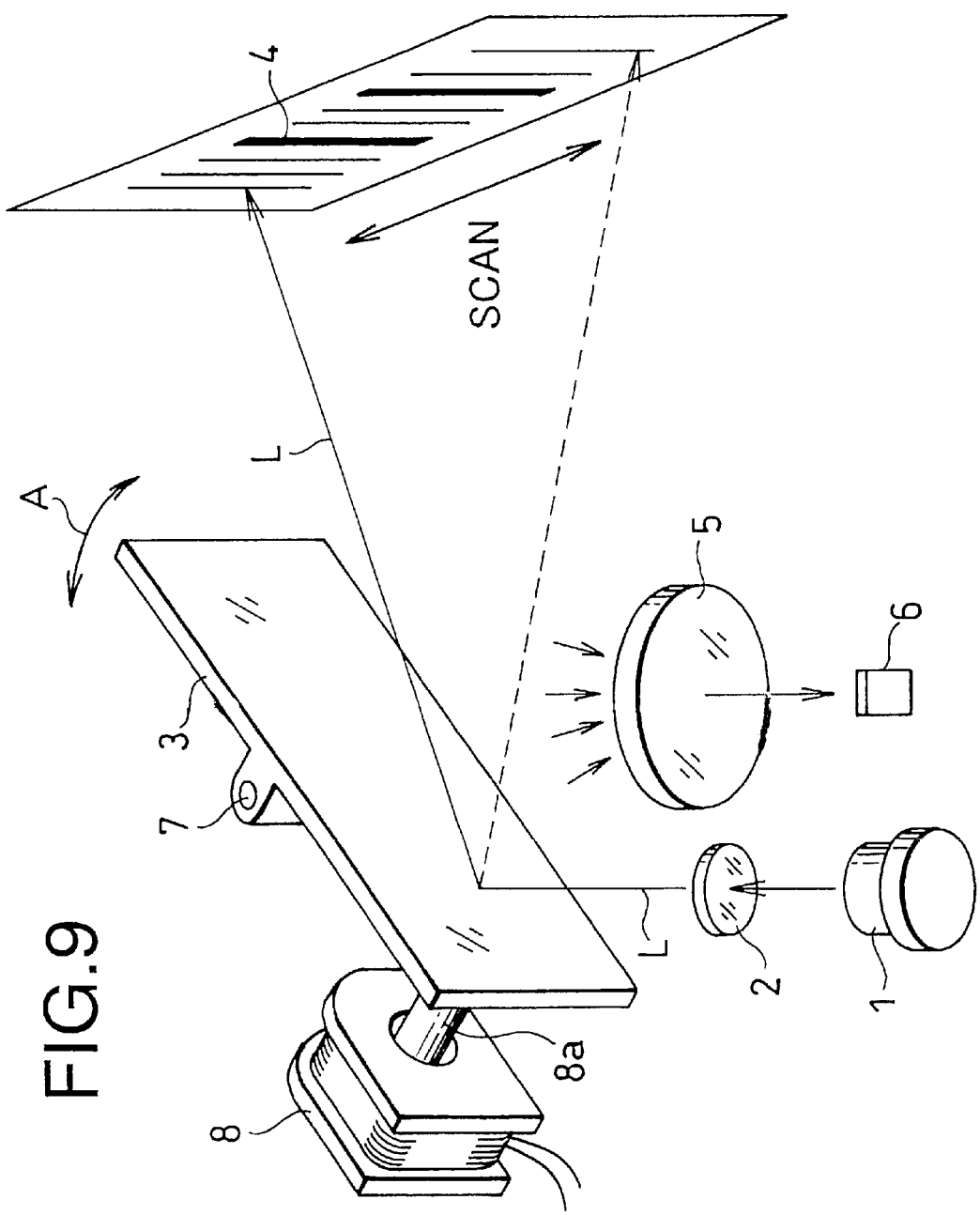
FIG. 9 is a schematic diagram showing a conventional optical scanning device.

A third embodiment of the invention will be described with reference to FIG. 5. An optical scanning device 31 according to the third embodiment of the present invention is distinct from the conventional optical scanning device described with reference to FIG. 9 in that its light receiving unit has a different structure therefrom.

Namely, although a laser beam L emitted from its light emitting unit 32 is condensed in a condenser lens 33 and reflected on a mirror 34 which serves as a light path conversion surface so as to be directed to a bar code 4, a reflected light reflected on the bar code 4 is allowed to be received by a light receiving unit 35 which is fixed directly on the mirror 34.

The mirror 34 is caused to swing around a swing axis 36 in directions indicated by an arrow A in a predetermined cycle driven by a drive rod 37a of a drive unit 37 which is comprised of an electromagnet, for example, thereby allowing the laser beam L from the light emitting unit 32 to scan the whole area of the bar code 4. In this operation, a returning light corresponding to a gradation pattern of the bar code 4 is received by the light receiving unit 35 mounted on the mirror 34 so as to read out information of the bar code 4.

According to this embodiment of the present invention, because that a space for installing the light reception related parts for receiving the returning light can be minimized, a more compact design of the device than conventional can be realized, and also an improved light reception efficiency can be obtained.

Respective embodiments of the invention have been described heretofore, however, the present invention should not be construed to be limited thereto, and various modifications thereof may be contemplated within the scope of the invention.

For example, in the first embodiment of the present invention described above, in order to enable for the light emitting unit 15 and the light receiving unit 16 to swing around the swing axis 13, it is arranged such that the movable member 13 is supported via the swing axis 13 which is provided on the fixed member 12. However, instead of the above arrangement, it may have such a structure as indicated in FIGS. 6A and 6B.

Figure 6A:
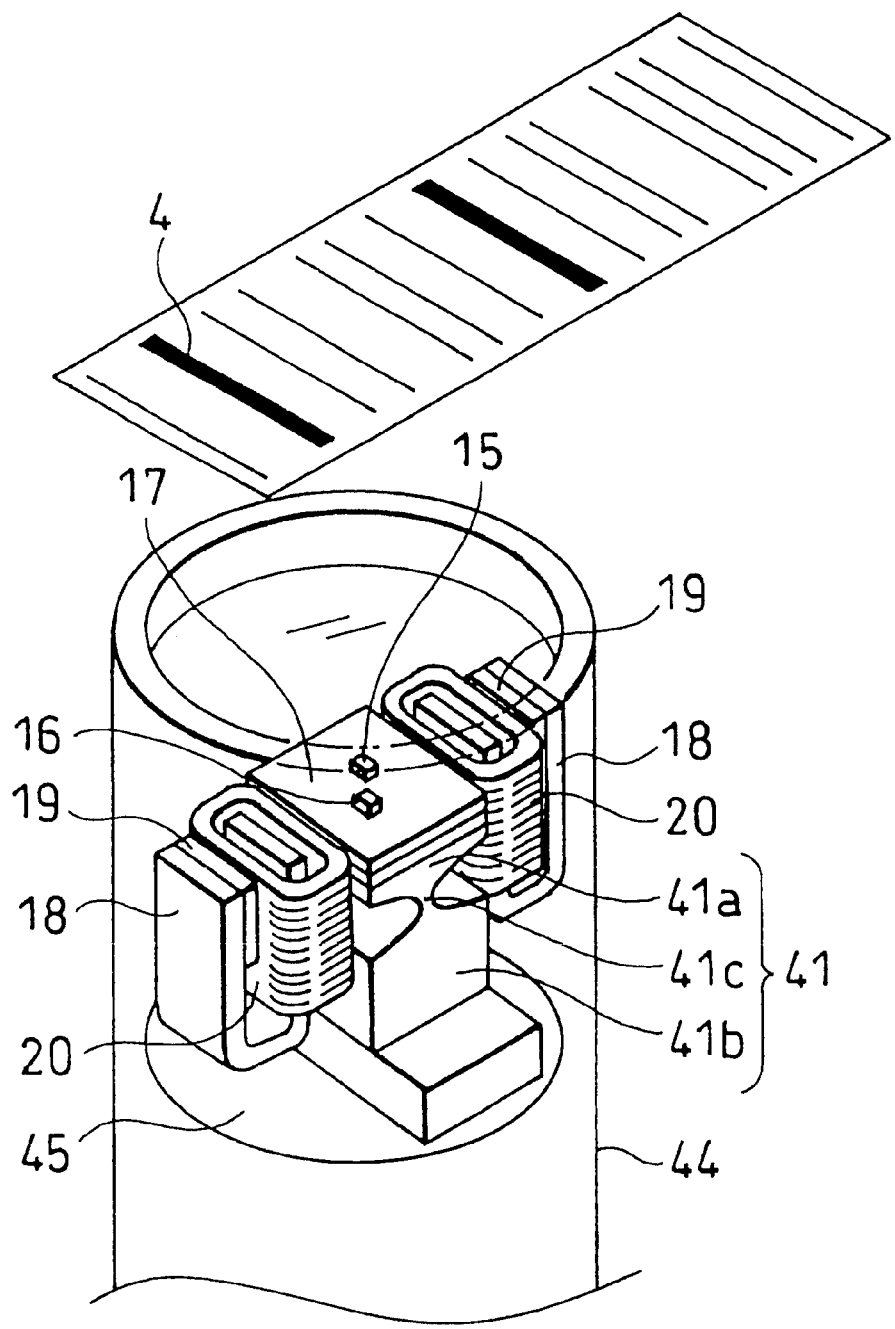
FIGS. 6A and 6B are perspective views each showing a modification of the optical scanning device of FIG. 1.

Namely, in an example of structures depicted in FIG. 6A, it is arranged such that a bottom surface of a substrate 17 having a light emitting unit 15 and a light receiving unit 16 mounted on its upper surface is supported by a movable end portion 41a belonging to a hinge member 41 which is made of a synthetic resin which is flexible, and that the movable end portion 41a is caused to swing via a hinge portion 41c of the hinge member 41 relative to a fixed end portion 41b of the hinge member 41 urged by an action of the drive portion described above comprising the pair of yokes 18, the permanent magnets 19 and the coil 20. The fixed end portion 41b of the hinge member 41 is firmly fixed on a mount base encased within a cylindrical casing 44 with an internal diameter approximately of 12 mm, for example, for accommodating this optical scanning device.

Figure 6B:
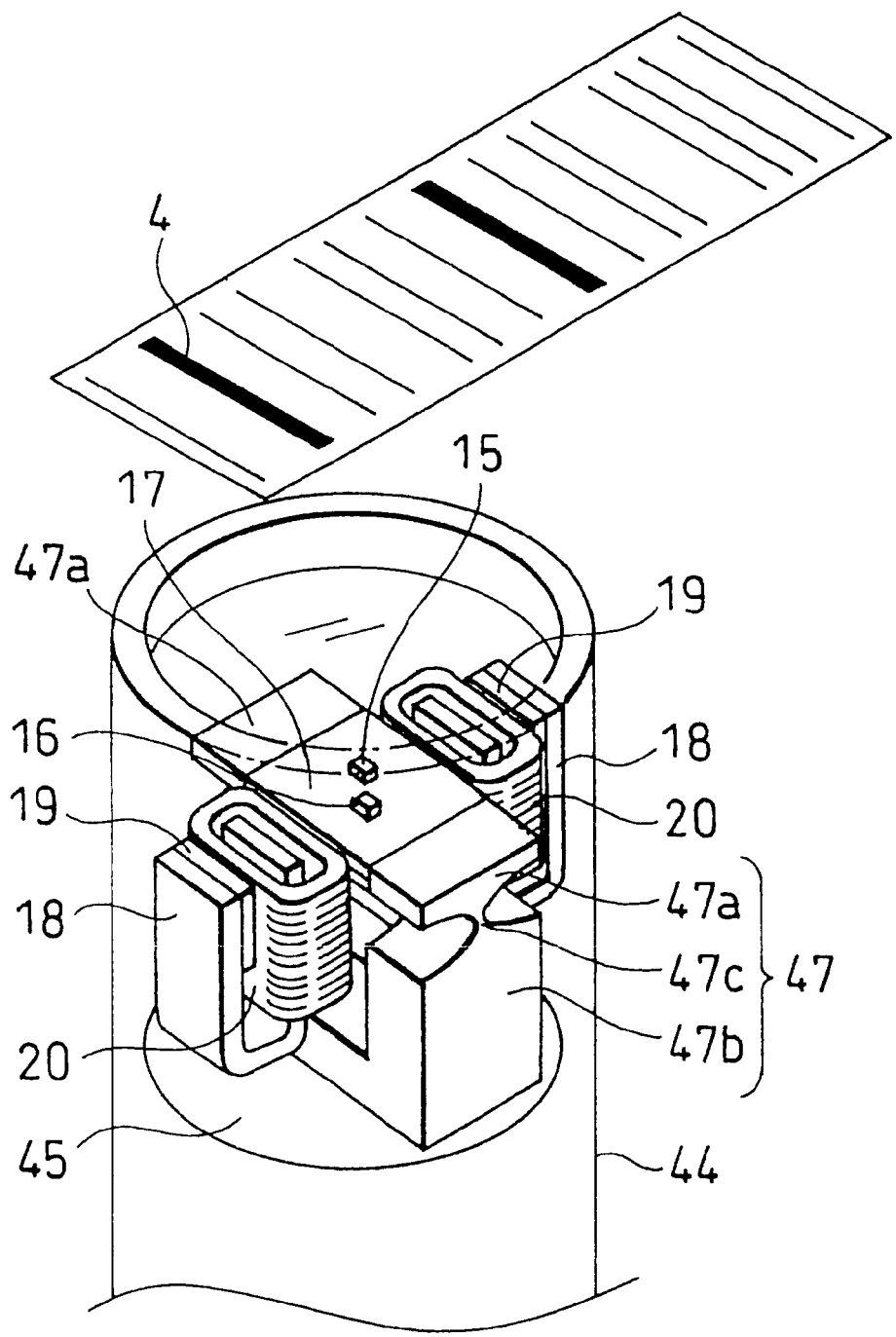

On the other hand, in another example depicted in FIG. 6B, it is arranged such that both side walls of a substrate 17 having a light emitting unit 15 and a light receiving unit 16 mounted on its upper surface are firmly supported by a pair of movable end portions 47a of a hinge member 47 made of a synthetic resin which is flexible, and that the pair of the movable end portions 47a are allowed to swing via each hinge portion 47c of the hinge member 47 relative to a common fixed end portion 47b thereof urged by an action of the drive mechanism described above comprising the pair of yokes 18, permanent magnets 19 and coil 20.

By adoption of the above-mentioned arrangements, whereby an entire portion of the drive unit is allowed to swing together with the substrate 17, the space needed for allowing the coil 20 to swing between the pair of yokes 18 required in the first embodiment is omitted, thereby enabling further to reduce a total size of the device compared to that of the first embodiment of the invention. Further, because it is only required to fix the substrate 17 directly on the movable end portions 41a or 47a of the hinge members 41 or 47, no special processing technique is required.

Figure 7A:
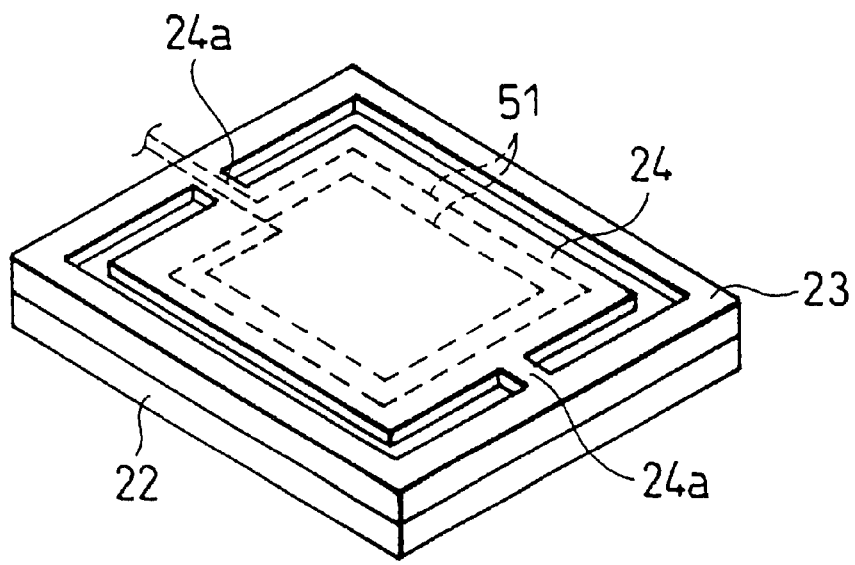
Figure 8A:
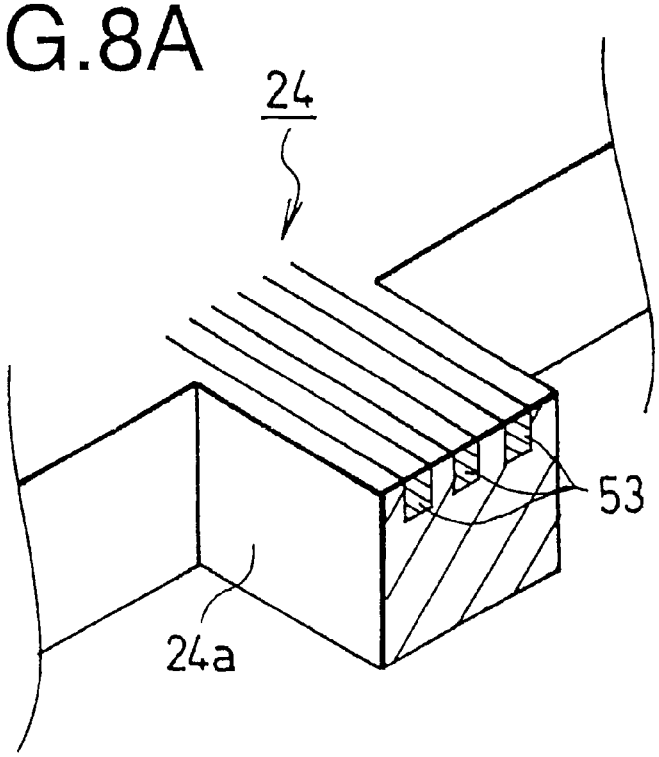
FIGS. 8A and 8B are perspective schematic views showing wiring arrangements in the second embodiment of the invention, where
Figure 8B:
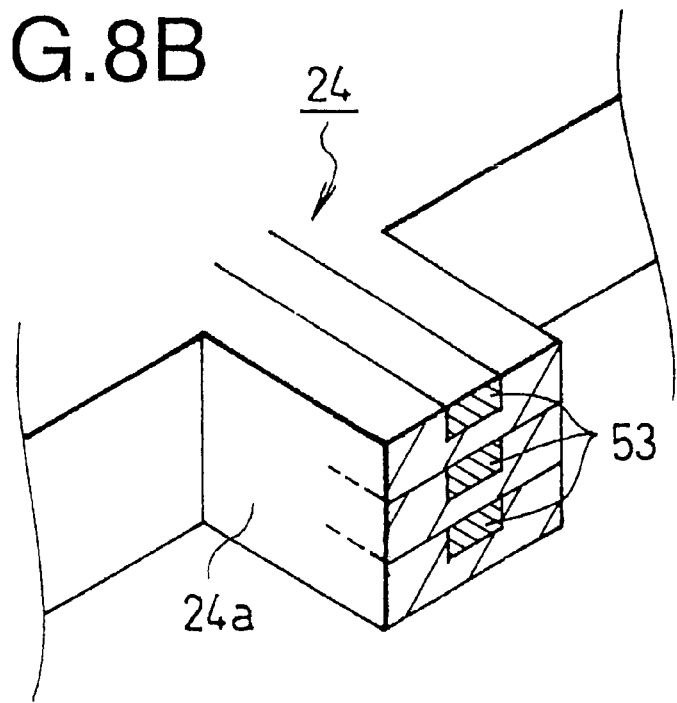

Still further, in the second embodiment of the invention described above, the swing motion of the movable member 24 relative to the glass substrate 22 is obtained using an electrostatic force acting therebetween, however, it is not limited thereto, and any other swing mechanism such as those depicted in FIGS. 7A and 8B may be adopted to the same effect.

Namely, in an example of structure depicted in FIG. 7A, an electric wiring 51 is formed into a spiral pattern in a surface of the movable member 24 using a conventional semiconductor processing technique, and, although not indicated, a drive unit having a similar structure as that of the first embodiment for generating a magnetic field in a direction perpendicular to a line connecting between a pair of bridging members 24a and 24a are disposed, then by flowing an AC current through the above-mentioned electric wiring 51, a whole portion of the movable member 24 is caused to swing around its swing axis along the line connecting between the pair of bridging members 24a and 24a.

Figure 7B:
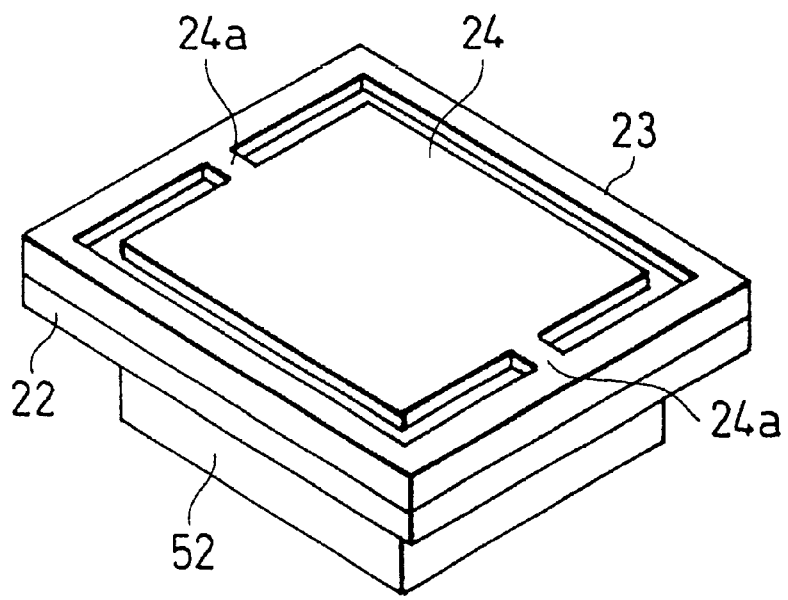

On the other hand, in an example of structure depicted in FIG. 7B, a piezoelectric body 52 is bonded on the bottom surface of a glass substrate 22, and a piezoelectric vibration is applied from the piezoelectric body 52 to the movable member 24 via the glass substrate 22 thereby enabling a whole portion of the movable member 24 to vibrate at a predetermined resonance frequency.

Any one of the above-mentioned structures may be adopted to produce the same operation and the same effect as those obtained in the second embodiment of the present invention. By way of example, in respective examples described above, positions of the pair of bridging members 24a of the movable member 24 are shown to be different from those in the second embodiment of the present invention, which, however, suggests that either of them may be adopted to the same effect. In addition, although its light emitting unit 15 and light receiving unit 16 are omitted from the drawing, it should be construed that they are arranged on the same surface of the movable member 24, and along its axial line of the swing axis as in the second embodiment of the present invention.

By way of example, in the structures of the aforementioned second embodiment as well as of the modifications thereof in FIGS. 7A and 7B, each lead-in wiring for the light emitting unit 15 and the light receiving unit 16 as well as a lead-in wiring 51 for swing driving indicated in FIG. 7A are laid from outside the device via the bridging members 24a and 24a of the movable member 24. Examples of wiring formed in the bridging member 24a are depicted in FIGS. 8A and 8B. Namely, FIG. 8A depicts an example of various types of wiring 53 which are formed in a planar and parallel structure while FIG. 8B depicts another example of various types of wiring 53 which are formed in a multi-layered structure. Further, a complex structure, which combines the aforementioned two examples of structures, may be adopted as well.

Further, in the description of the aforementioned embodiments of the present invention, the light emitting unit 15 and the light receiving unit 16 are described to be prepared separately and be mounted on the movable member, however, it is not limited thereto, and these light emitting unit and the light receiving unit may be formed integral with the movable member using the conventional semiconductor processing technique. In this case, because an alignment control of the light emitting unit and the light receiving unit can be attained at a very high precision simultaneously at the time of manufacture of the movable member, no adjustment in optical alignment is needed thereby simplifying a post processing, and contributing substantially to a labor saving and a cost reduction.

Still further, in a case where the above-mentioned structure is applied to the third embodiment of the present invention, the mirror itself serving as the light path conversion surface can be constructed to serve also as a light receiving unit. Thereby, a further improvement in the efficiency of light reception can be attained. In this case, what is required is only to apply a mirror polishing or the like over a whole area of the light receiving unit so as to be able to convert the light path of the laser beam L.

Furthermore, in the first and the second embodiments of the present invention described above, both of the light emitting unit 15 and the light receiving unit 16 are described to be mounted on the movable member 14 or 24, however, it may be arranged to the same effect such that either of the light emitting unit 15 and the light receiving unit 16 is mounted thereon, and the other one is disposed separately.

Finally, in the above description of respective preferred embodiments of the optical scanning device according to the invention, it has been described by way of example as applied to the bar code reader, however, it is not limited thereto, and various other applications can be contemplated within the scope of the invention including such as an optical reader (optical pick-up) of an optical disk, a control mechanism for optical communications, and an optical scanning device for scanning a stationary or moving object such as for an automobile distance detection device or an obstruction detection device.

Although the invention has been described in its preferred form with a certain degree of particularity, obviously many changes and variations are possible therein. It is therefore to be understood that the present invention may be practiced otherwise than as specifically described herein without departing from the scope and the sprit thereof.

What is claimed is:

1. An optical scanning device for acquiring information from an object by scanning said object with a light emitted from a light emitting unit and receiving a reflected light from the object on a light receiving unit, comprising:
   a movable member on which said light emitting unit and said light receiving unit are mounted;
   a fixed member for supporting said movable member swingably; and
   a drive unit for driving said movable member to swing, wherein:
   said light emitting unit and said light receiving unit are disposed on a same surface of said movable member along and on a swing axial line of said movable member relative to said fixed member.

2. The optical scanning device according to claim 1, wherein said movable member is supported via an axial portion that is installed on said fixed member.

3. The optical scanning device according to claim 1, wherein said movable member is opposed to said fixed member and spaced apart therefrom at a predetermined distance, and is supported by said fixed member via two points in a periphery of said movable member.

4. The optical scanning device according to claim 1, wherein said movable member is supported on said fixed member via a flexible hinge that is made of a synthetic resin and provided on said fixed member.

5. The optical scanning device according to claim 1, wherein said drive unit comprises:
   a magnetic field generation unit for generating a magnetic field in a direction perpendicular to a line of swing axis of said movable member; and
   a coil that is provided in said movable member so as to traverse said magnetic field.

6. An optical scanning device for acquiring information from an object by scanning with a light emitted from a light emitting unit and receiving a reflected light from the object, comprising:
   a swing axis; and
   an optical path conversion surface for redirecting a path of light from said light emitting unit to said object while said optical path conversion surface swings around said swing axis, and for receiving a light of reflection from the object, wherein:
   a light receiving unit is mounted on said optical path conversion surface along and on said swing axis.

7. The optical scanning device according to claim 6, wherein said optical path conversion surface comprises a light receiving surface of said light receiving unit.

* * * * *

UNITED STATES PATENT AND TRADEMARK OFFICE
CERTIFICATE OF CORRECTION

PATENT NO. : 6,549,348 B2
DATED : April 15, 2003
INVENTOR(S) : Hidekuni Aizawa et al.

It is certified that error appears in the above-identified patent and that said Letters Patent is hereby corrected as shown below:

<u>Title page,</u>
Item [57], ABSTRACT,
Line 12, replace "bean" with -- beam --.

Signed and Sealed this

Seventh Day of October, 2003

JAMES E. ROGAN
*Director of the United States Patent and Trademark Office*